US012777664B2

(12) United States Patent
Jessen et al.

(10) Patent No.: US 12,777,664 B2
(45) Date of Patent: Oct. 27, 2026

(54) THIN FILM RESISTOR MISMATCH IMPROVEMENT USING A SELF-ALIGNED DOUBLE PATTERN (SADP) TECHNIQUE

(71) Applicant: TEXAS INSTRUMENTS INCORPORATED, Dallas, TX (US)

(72) Inventors: Scott William Jessen, Allen, TX (US); Steven Lee Prins, Fairview, TX (US); Sameer Prakash Pendharkar, Allen, TX (US); Abbas Ali, Plano, TX (US); Gregory Boyd Shinn, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 936 days.

(21) Appl. No.: 17/957,983

(22) Filed: Sep. 30, 2022

(65) Prior Publication Data

US 2024/0113156 A1 Apr. 4, 2024

(51) Int. Cl.

| | |
|---|---|
| ***H10D 1/47*** | (2025.01) |
| ***H10D 84/80*** | (2025.01) |
| ***H10P 76/20*** | (2026.01) |
| ***H10P 76/40*** | (2026.01) |

(52) U.S. Cl.

CPC ........... *H10D 1/474* (2025.01); *H10D 84/811* (2025.01); *H10P 76/2041* (2026.01); *H10P 76/2043* (2026.01); *H10P 76/4085* (2026.01)

(58) Field of Classification Search

None

See application file for complete search history.

(56) References Cited

U.S. PATENT DOCUMENTS

| | | | | |
|---|---|---|---|---|
| 2009/0231085 | A1* | 9/2009 | Hakey | H01C 3/12 338/307 |
| 2018/0364567 | A1* | 12/2018 | Chou | H01L 21/0273 |

OTHER PUBLICATIONS

Patel, K. et al. "Comparative study of line width roughness (LWR) in next-generation lithography (NGL) processes." Proc. SPIE 7640, Optical Microlithography XXIII, 76400T (Mar. 12, 2010); doi: 10.1117/12.848183. 14 pages.

Koike, Kyohei, et al. "Desirable material selection on self-aligned multi-patterning." Proc. SPIE 10586, Advances in Patterning Materials and Processes XXXV, 105861F (Mar. 13, 2018); doi: 10.1117/12.2297297. 9 pages.

* cited by examiner

*Primary Examiner* — Alexander G Ghyka

(74) *Attorney, Agent, or Firm* — Andrew R. Ralston; Charles F. Koch

(57) ABSTRACT

A passive circuit component includes an edge having a low line edge roughness (LER). A method for manufacturing the passive circuit component includes a self-aligned double patterning (SADP) etch process using a tri-layer process flow. The tri-layer process flow includes use of an underlayer, hard mask, and photoresist. The passive circuit component made by this method achieves improved mismatch between like components due to the low LER.

17 Claims, 13 Drawing Sheets

THIN FILM RESISTOR MISMATCH IMPROVEMENT USING A SELF-ALIGNED DOUBLE PATTERN (SADP) TECHNIQUE

BACKGROUND

Thin film resistor mismatch is defined as the difference in the value of a resistor parameter (e.g., resistance) among generally identically designed resistors. Reducing thin film resistor mismatch is difficult due to, inter alia, line edge roughness (LER) often associated with the pattern transfer process (e.g., photoresist patterning and the etch process). LER is defined as a deviation of a feature edge from a smooth, ideal sidewall surface. With higher LER, an increased mismatch occurs between one resistor and its neighboring resistor because the edges are less smooth than for resistors having lower LER, resulting in variability in the width of the resistor along those edges. Moreover, for a given LER, narrower resistors are more affected by the variable width. It is desirable to have those edges as smooth as possible so that resistor-to-resistor matching is improved. Therefore, LER should be as small as possible to improve thin film resistor matching.

SUMMARY

One example provides a method of forming an integrated circuit that includes receiving semiconductor substrate with a material layer thereover. A hard mask is formed over an underlayer located over the material layer. The hard mask is patterned, therefrom forming a hard mask line. Spacers are formed on sidewalls of the hard mask line, and the hard mask line between the spacers is removed, thereby forming a spacer line pattern. A block mask pattern is formed over the spacers and the underlayer, and the block mask pattern is transferred to the underlayer, thereby forming an exposed portion of the material layer. The exposed portion of the material layer is removed, and the spacer line pattern is transferred to the material layer, thereby forming a patterned material layer.

In another example, a method of forming an integrated circuit includes forming a sacrificial layer pattern over a conductive layer located over a substrate. Dielectric spacers are formed on sidewalls of the sacrificial layer pattern and the sacrificial layer is removed between the dielectric spacers, thereby forming a spacer pattern. The spacer pattern is transferred to the conductive layer thereby forming a conductive pattern.

BRIEF DESCRIPTION OF THE DRAWINGS

For a detailed description of various examples, reference will now be made to the accompanying drawings in which.

The same reference number is used in the drawings for the same or similar (either by function and/or structure) features.

DETAILED DESCRIPTION

This description provides examples of the fabrication of a resistor to reduce LER.

The resistor may be a thin-film or non-thin-film resistor. Although the embodiments described pertain to resistors, the manufacturing techniques of this description can be applied to the fabrication of other types of passive components such as capacitors or inductors. Such alternatives are considered to be within the spirit and scope of the present description, and may utilize the advantages of the configurations and embodiments described herein.

For thin film resistors, reducing mismatch between resistors is desirable in many applications. Reducing LER helps to reduce the mismatch between thin film resistors on the same die and between the corresponding resistors on different dies of the same integrated circuit design. LER is associated with both the photoresist patterning and the etch process. Specifically, with standard lithography and etch techniques which include patterning a photoresist directly on a substrate, because of the chemically amplified resist that is used, rougher edges of the resistors are exhibited which create a pseudo-oscillatory pattern along that entire edge. The smaller the feature that is patterned, the worse the LER becomes. With higher LER, a mismatch occurs between one resistor and its neighboring resistor because the edges are not precisely smooth resulting in variability in the width of the resistor along those edges, resulting in imprecise resistor values. A goal is to have the edges as smooth as reasonably possible for a given application thereby improving the resistor-to-resistor match. For at least these reasons, it is desired to reduce the LER as much as possible.

An aspect of this disclosure reduces LER for thin film resistors by using, inter alia, a tri-layer fabrication approach which includes spin coating an underlayer above a substrate, then spin coating a silicon-containing hard mask above the underlayer, and then using a photoresist to transfer a pattern through the hard mask and the underlayer to the substrate. With this technique, the deposition process drives/controls the pattern transfer. In addition, the minimum pitch of the process can be cut in half (e.g., 100 nm pitch becomes 50 nm) and more resistors can be fit per unit area (e.g., 100 nm pitch doubles to 50 nm and therefore doubles number of resistors per unit area). Compared to conventional fabrication techniques, the process described herein results in substantially lower mismatch and permits smaller high precision resistors to be fabricated, e.g., having widths as low as 25 nm in the example above.

Figure 1:
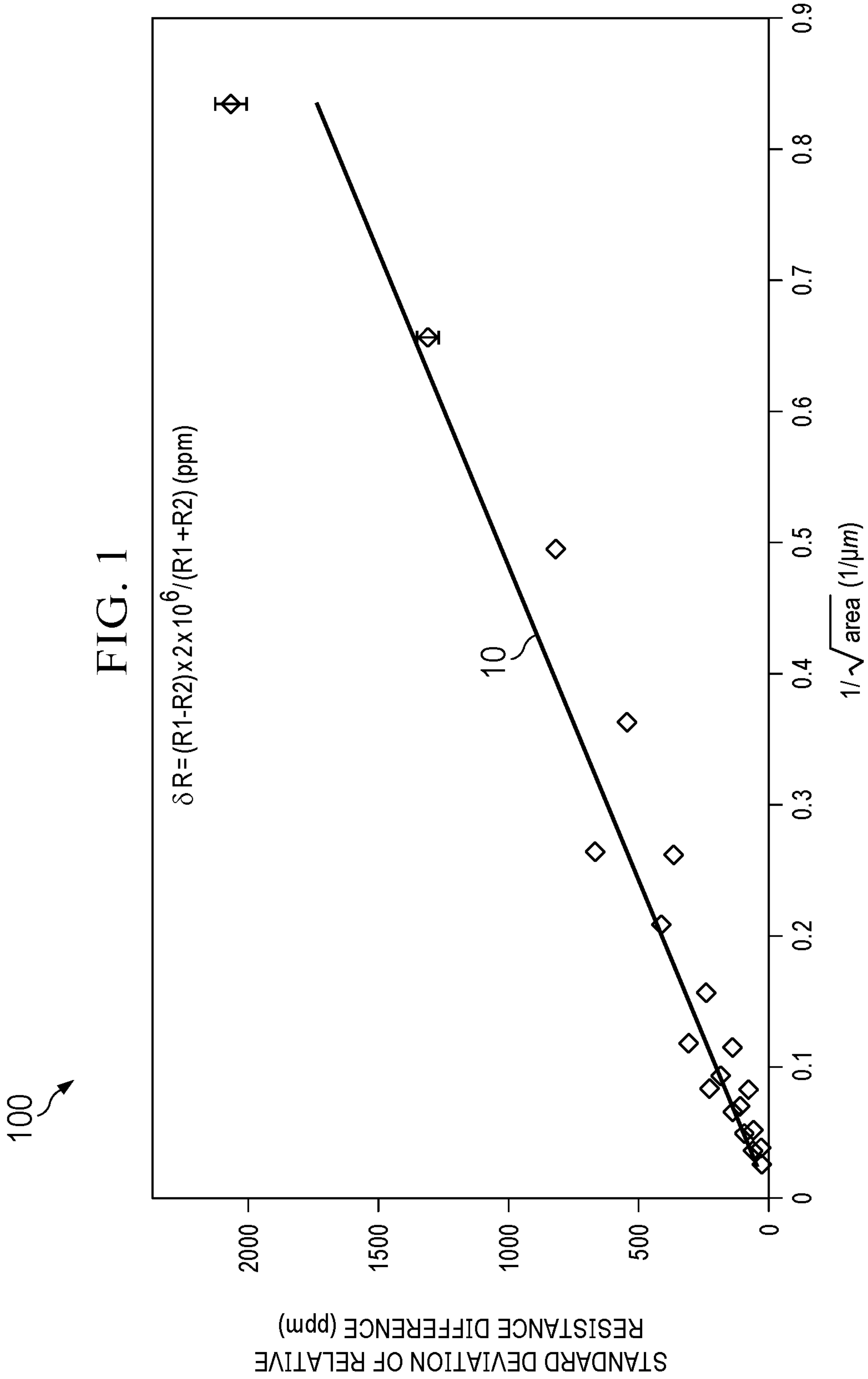
FIG. 1 is a plot illustrating the standard deviation of relative resistance difference as a function of the inverse of the square of the cross-sectional area for two identically drawn, adjacent resistors, corresponding to the resistors shown in FIG. 2B.
Figure 2A:
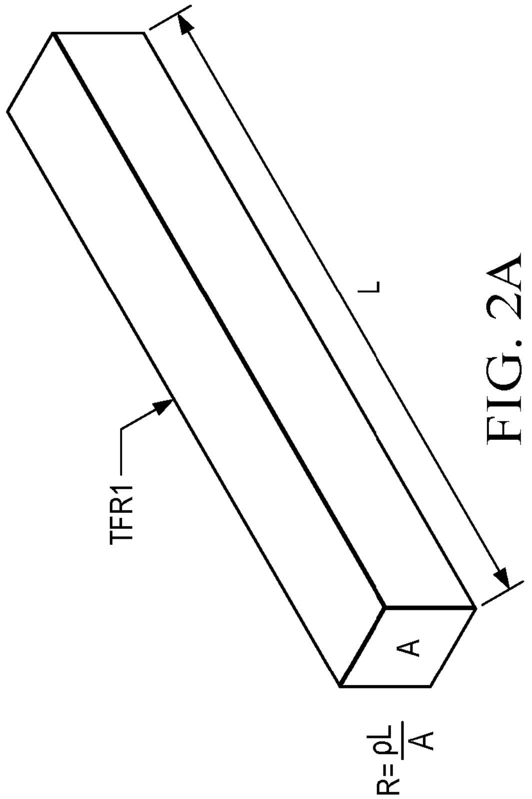
FIG. 2A is a perspective view of one resistor in accordance with an example.
Figure 2B:
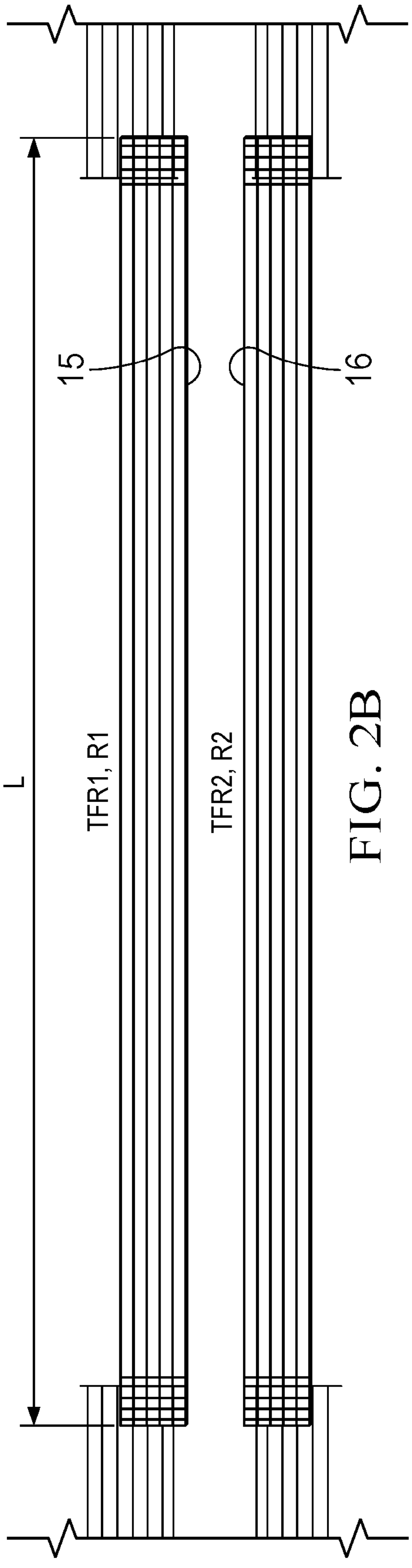
FIG. 2B is a plan view of two adjacent resistors of the type shown in FIG. 2A.

FIG. 1 shows a plot 100 of standard deviation of relative resistance (along the y-axis, in ppm) as a function of the inverse of the square of the cross-sectional area ($1/\sqrt{\text{area}}$, along x-axis, in $\mu m^{-1}$) for a population of two illustrative adjacent resistors, such as exemplified by resistors shown in FIG. 2B. In the FIG. 1 plot 100, the curve 10 is a best fit to the data which depicts a measure of mismatch between two identically drawn resistors. Curve 10 shows that the standard deviation of relative resistance difference increases as the inverse of the square of the area of the resistor increases. In other words, as resistors become smaller, the standard deviation of relative resistance increases, and resistor mismatch increases. It is desirable that curve 10 have a small slope, ideally zero slope, so that the standard deviation for small resistors is smaller. Since LER may be generally similar regardless of line width, the LER for a particular resistor population on a device is expected to have a greater effect on the standard deviation for resistors having a smaller line width than resistors having a larger line width. Thus, decreasing the LER would be expected to reduce the slope of the best fit line to the standard deviation data, indicating less sensitivity to LER across the range of resistor line widths in the sample population. While the reduction of LER may be particularly beneficial for reducing variation between nominally matched resistors formed in close proximity in a semiconductor device, reduced LER is also expected to be beneficial for reducing departure of non-adjacent resistors (e.g., those positioned on opposite sides of the same chip) from nominal design values, the reduction expected from lower LER achieved via the tri-layer (SADP) approach described herein.

FIG. 2A is a perspective view of one resistor line portion in accordance with an example. Resistance (R) is inversely proportional to the cross-sectional area (A) of a material in accordance with the formula: $R=\rho L/A$ (where R is the resistance of the material, ρ is the resistivity of the material, L is the length of the material, and A is the cross-sectional area of the material). FIG. 2A illustrates this relationship (and the corresponding dimensions via a perspective view) for resistor TFR1 shown in FIG. 2B. With reference to FIG. 2B, making edge 15 of resistor TFR1 and edge 16 of resistor TFR2 as smooth as possible (i.e., by achieving a lower LER), improves mismatch. A higher degree of LER along the edges of the resistors results in worse mismatch because the variation in the corresponding cross-sectional areas A along the length of the resistors is higher, and may be different for the resistor TFR1 than for the resistor TFR2. With worse mismatch, the potential difference in resistances between resistors TFR1 and TFR2 becomes larger. Such variation may result in deviations of circuit functionality from the ideal (design) case and may limit the accuracy and/or precision of the circuit functionality.

Examples described herein provide innovative manufacturing techniques that results are expected to result in lower LER of conductive lines, such as those used in TFRs or other components, thereby resulting in a lower mismatch characteristic. While such examples may be expected to provide a reduction of line-edge roughness and improved matching of nominally identical devices, no particular result is a requirement of the present invention unless explicitly recited in a particular claim.

Figure 3:
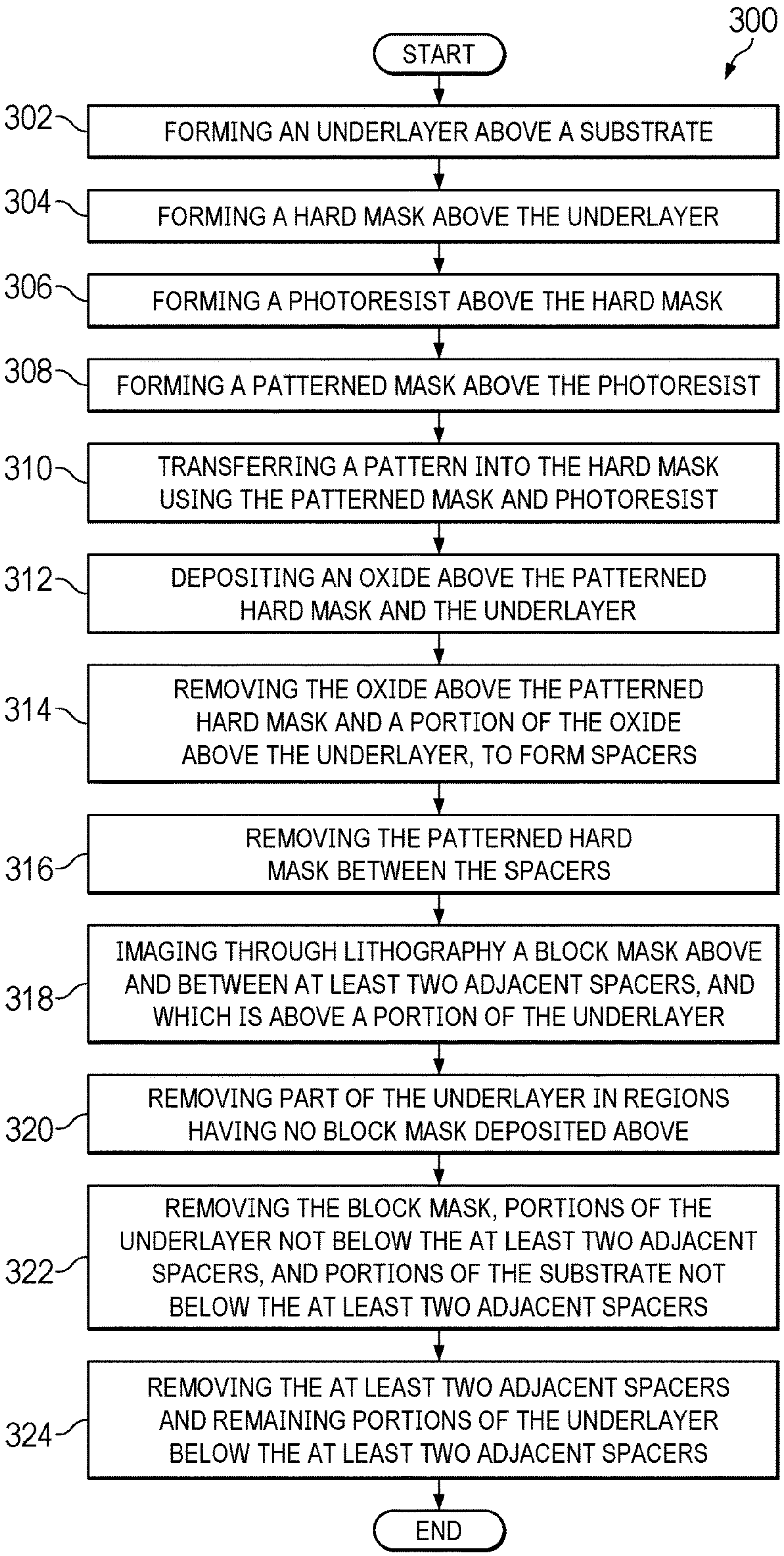
FIG. 3 is a flowchart illustrating a method for manufacturing a passive circuit component in accordance with an example.

FIG. 3 is a flowchart illustrating a method 300, e.g. a self-aligned double pattern (SADP) method, for manufacturing passive circuit components such as TFRs as exemplified by the resistors TFR1 and TFR2 shown in FIG. 2B, in accordance with various examples. FIGS. 4A-4I are cross-sectional views of an example process at various stages of manufacturing, consistent with the steps of the method 300 shown in FIG. 3. FIGS. 5A-5F are plan views of an example process consistent with FIGS. 4A-4I. Methods consistent with FIGS. 3, 4A-4I and 5A-5F are expected to reduce etch-induced line width variation resulting in reduced LER, or smoother and more uniform resistor sides.

Figure 4A:
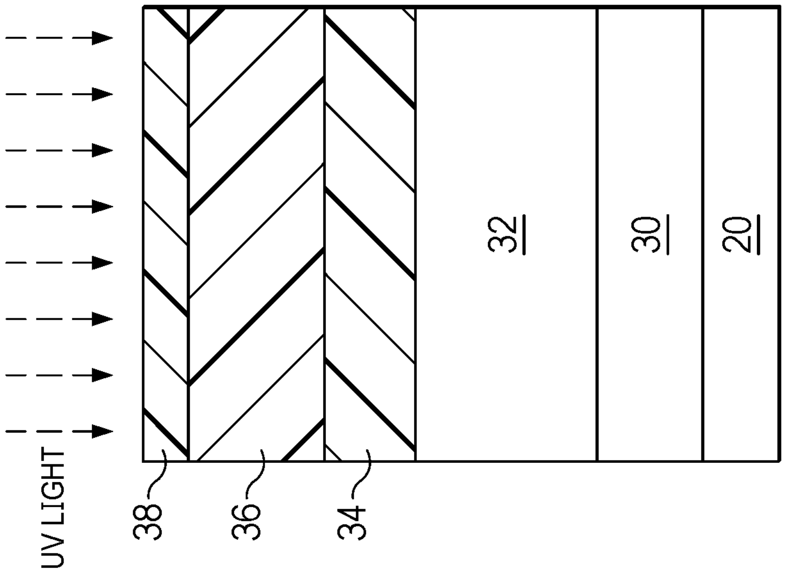
FIGS. 4A-4I are cross-sectional views of process steps of a method for manufacturing one of the resistors shown in FIG. 2B.

Method 300 includes forming an underlayer on a substrate (block 302). FIG. 4A shows a corresponding example including forming an underlayer 32 above a conductive or resistive material layer 30. The material layer 30 is formed over a semiconductor substrate 20, possibly with intervening layers including, e.g. a dielectric isolation layer. Forming the underlayer may be performed via, for example, spin coating of a cross-linking polymer. The material layer 30 may comprise any suitable material, for example and without limitation, $Ni_mCr_n$ or a composite of $Si_xC_yCr_z$ and alloys thereof, wherein m, n, x, y and z may depend on specific needs and applications. More specific examples include nichrome (NiCr), silicon-chromium (SiCr), and silicon-silicon carbide-chromium (SiCCr). In some examples the material layer 30 is formed by physical vapor deposition (PVD) using a composite target that includes appropriate elemental concentrations to result in the desired layer composition.

Method 300 also includes forming a hard mask above the underlayer (block 304). FIG. 4A also shows a corresponding example including forming a hard mask 34 above the underlayer 32. In this step, a silicon-containing polymer may be spin-coated onto the underlayer 32. The silicon-containing polymer may include, for example, poly(dimethylsiloxane), and may be used according to manufacturer's specifications. In some examples the hard mask 34 may be photo-definable, while in other example the hard mask 34 may be patterned using an additional photo-definable layer.

Method 300 shows an example in which the hard mask 34 is patterned using a photoresist layer (block 306) to form a hard mask line. FIG. 4A shows a corresponding example including patterning a photoresist layer 36 above the hard mask 34. The photoresist 36 may be a photo-definable carbon-based polymer, such as a photoresist or BARC (bottom anti-reflective coating). In some examples, the photoresist 36 and the hard mask 34 have a different etch rate in a plasma-based etch process such that the etch selectively etches the photoresist 36.

Method 300 further includes illuminating the photoresist layer 36 using a mask (block 308). FIG. 4A further shows a corresponding example including forming a mask 38 above the photoresist 36 to selectively expose the photoresist 36 to UV light. Such a process may be implemented on a stepper or scanner. Not shown, the exposed photoresist 36 is developed, or partially removed by a solvent, to remove exposed photoresist 36 if the photoresist is a positive resist, or to remove unexposed photoresist 36 if the photoresist 36 is a negative resist.

Figure 4B:
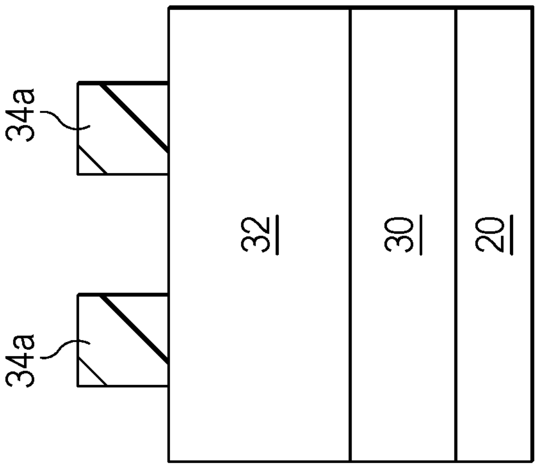
Figure 5A:
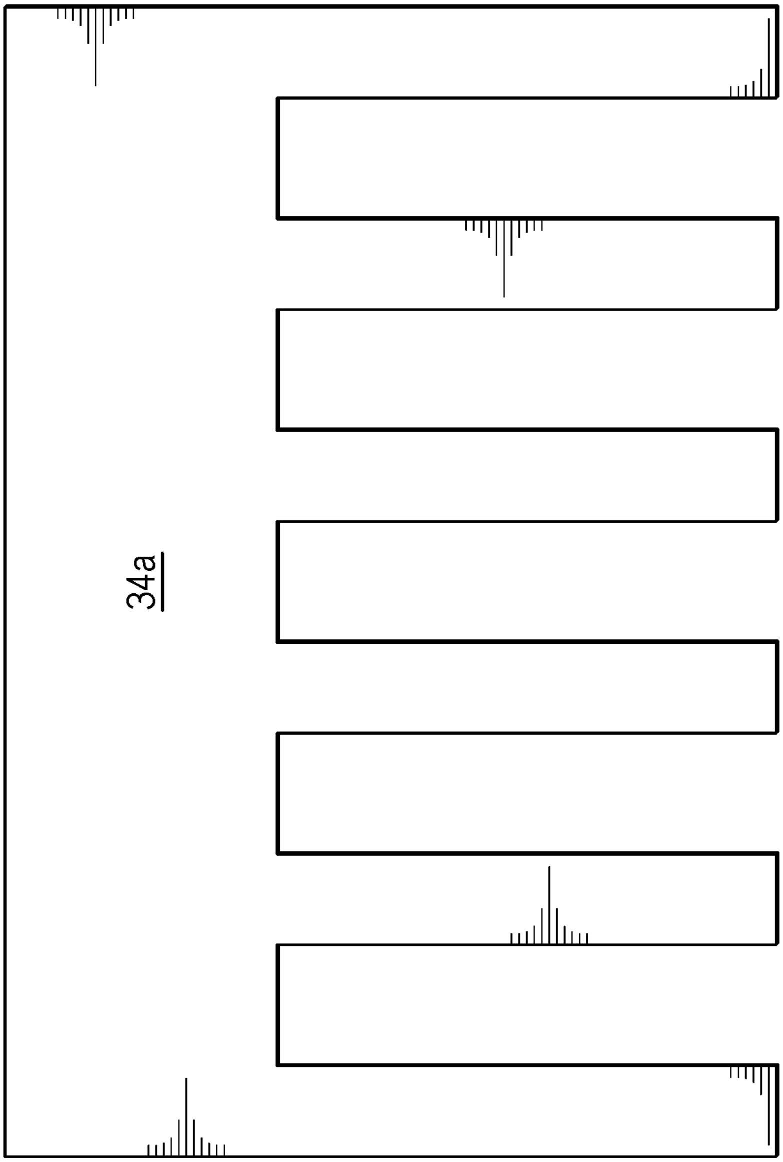
FIGS. 5A-5F provide plan views of conductive structure at various stages of manufacturing according to various examples.
Figure 5B:
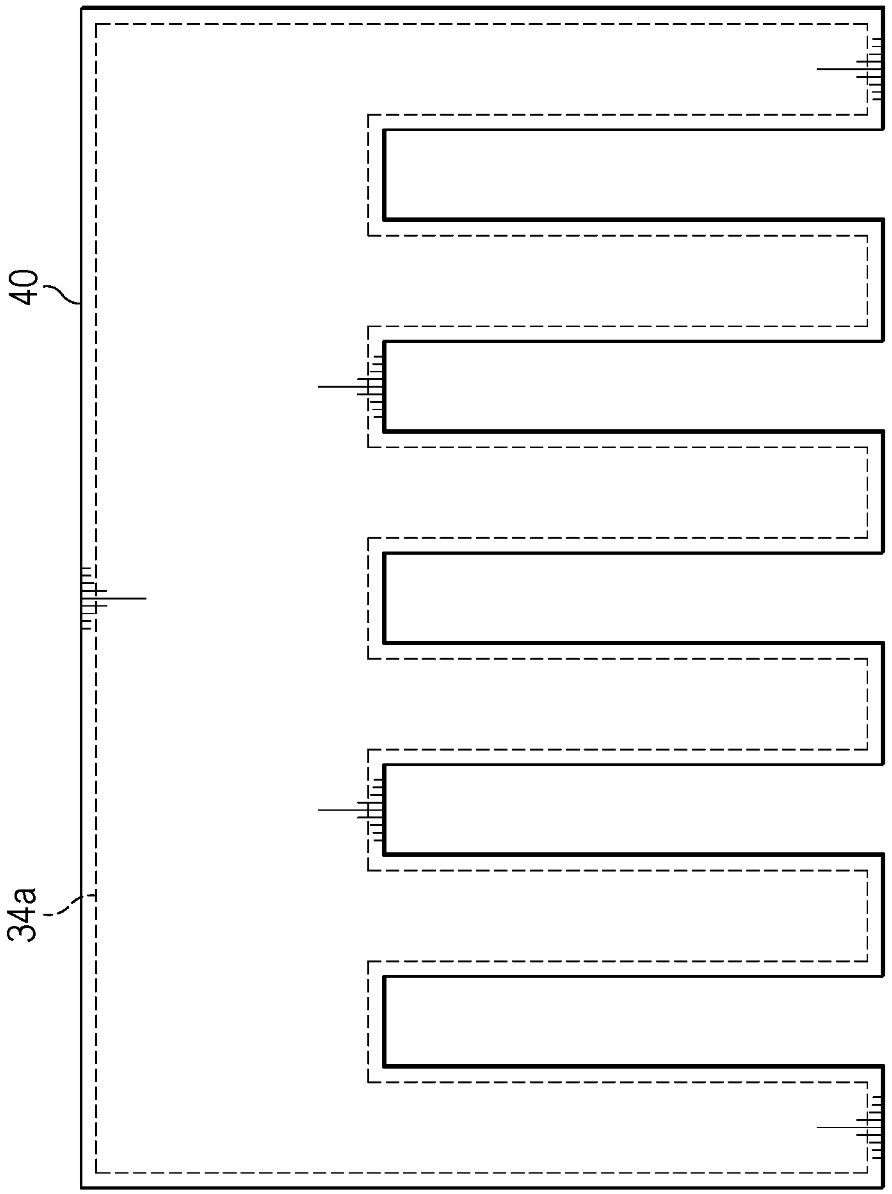

Method 300 further includes transferring the photoresist pattern into the hard mask using the patterned photoresist (block 310). Not shown, an etch process such an $CF_4/O_2$ plasma may be used to remove portions of the hard mask layer 34 unprotected by the photoresist 36 pattern. Such a plasma may preferable selectively remove the exposed hard mask 34, preserving the patterned photoresist 36 pattern for the duration of the process. Alternatively, in some examples the photoresist 36 may be omitted and the hard mask 34 may be directly patterned using the mask 38 and light exposure. FIGS. 4B and 5A further show a corresponding example including patterned hard mask 34*a* (e.g., the hard mask line, sacrificial layer pattern, or sacrificial hard mask layer pattern) after either method.

Figure 4C:
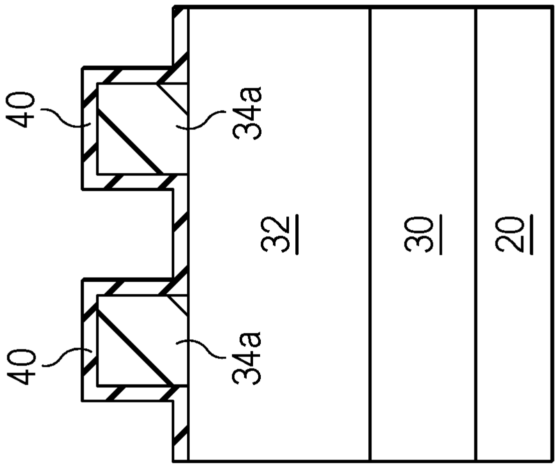

Method 300 further includes depositing a dielectric layer, e.g. a silicon oxide layer, on exposed surfaces of the hard mask and the underlayer (block 312). FIG. 4C shows a corresponding example including a deposited dielectric layer such as silicon oxide layer 40 (shown also in FIG. 5B) on exposed surfaces of the patterned hard mask 34*a* and the underlayer 32. In this step, the depositing may be performed via, for example, atomic layer vacuum depositing. This process may result in a uniform and conformal layer of silicon oxide on the patterned hard mask 34*a*.

Figure 4D:
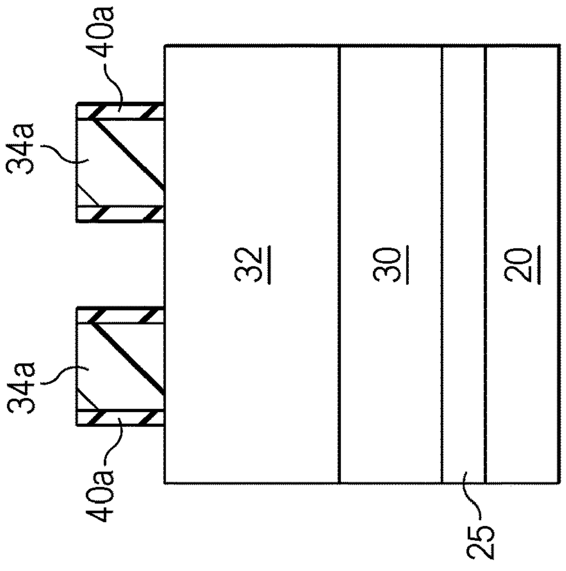
Figure 5C:
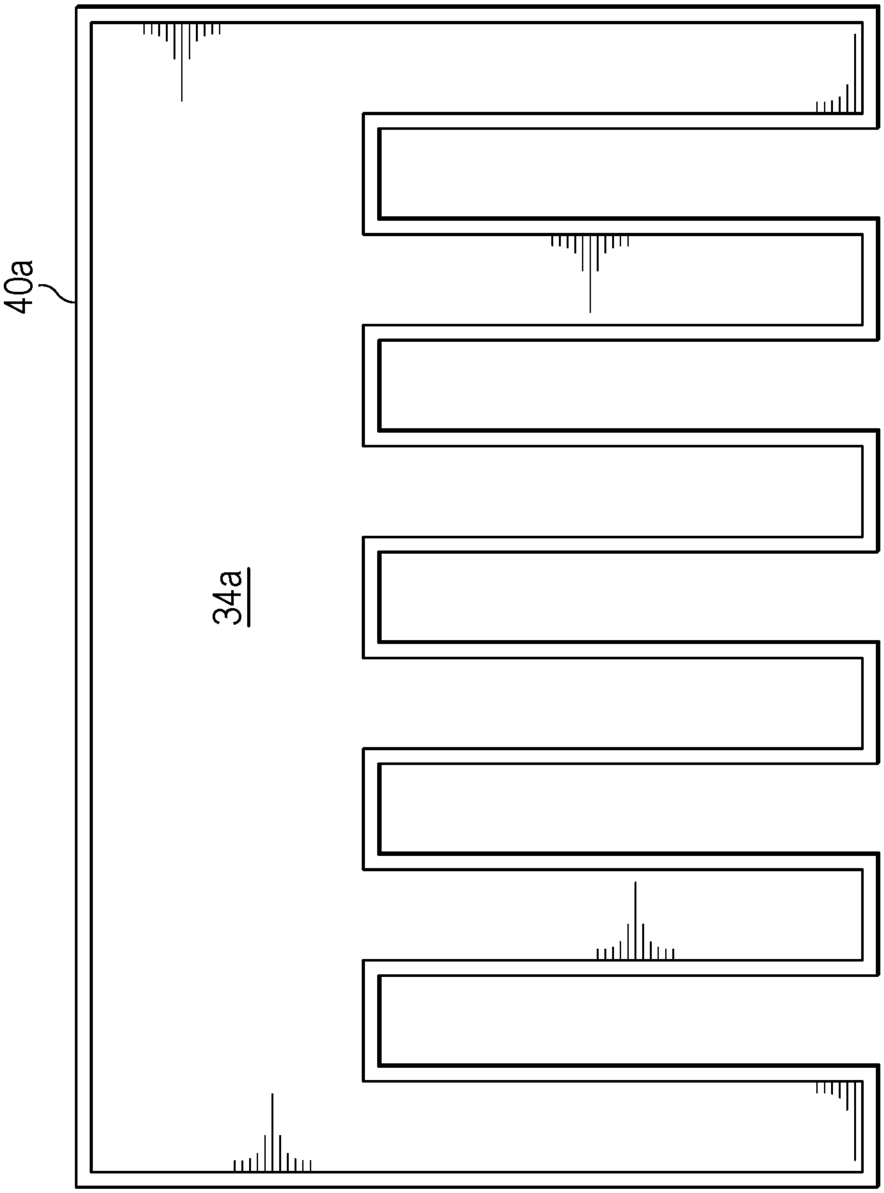

Method 300 further includes removing the silicon oxide on horizontal surfaces, such as above the patterned hard mask and a portion of the oxide above the underlayer, to form sidewall spacers (block 314). FIGS. 4D and 5C show a corresponding example after partial removal (e.g., anisotropically) of the silicon oxide layer 40, leaving sidewall dielectric (or oxide) spacers 40*a* formed on sidewalls of the patterned hard mask 34*a*, including hard mask lines. In this step, removal of the silicon oxide may be performed via, for example, isotropic-type reactive-ion etching (RIE). In this example, the material layer 30 is formed over a dielectric layer 25 which may be referred to as an isolation layer. The dielectric layer 25 is formed over semiconductor substrate 20, and may be or include, for example, shallow trench isolation (STI) or local oxidation of silicon (LOCOS).

Figure 4E:
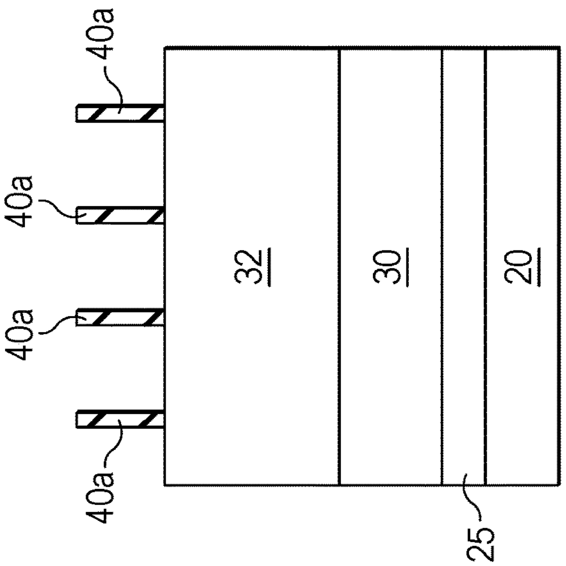
Figure 5D:
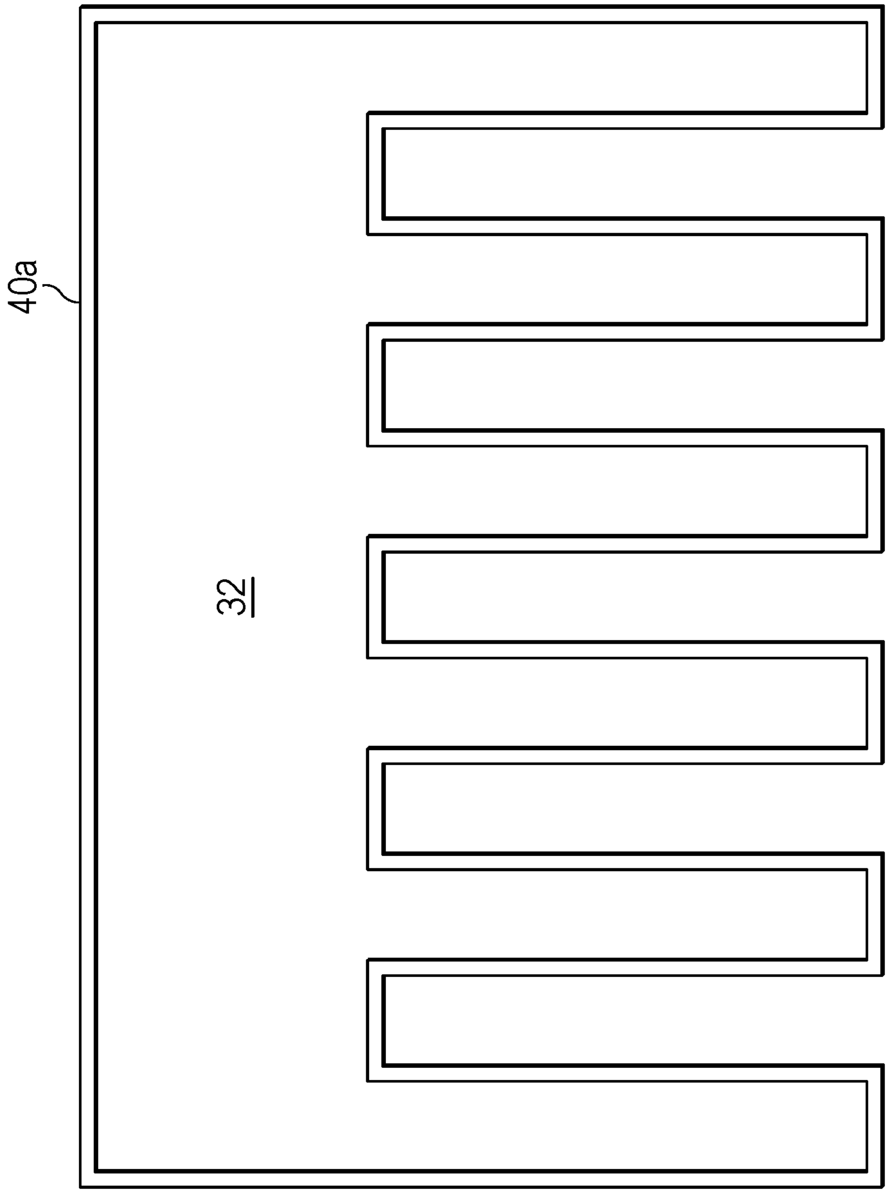

Method 300 further includes removing the patterned hard mask between the spacers (block 316) to form a spacer pattern or spacer line pattern. FIGS. 4E and 5D show a corresponding example after the patterned hard mask 34*a* has been removed between the spacers 40*a*. In this step, the removing of the patterned hard mask between the spacers may be performed via, for example, another RIE process.

Figure 4F:
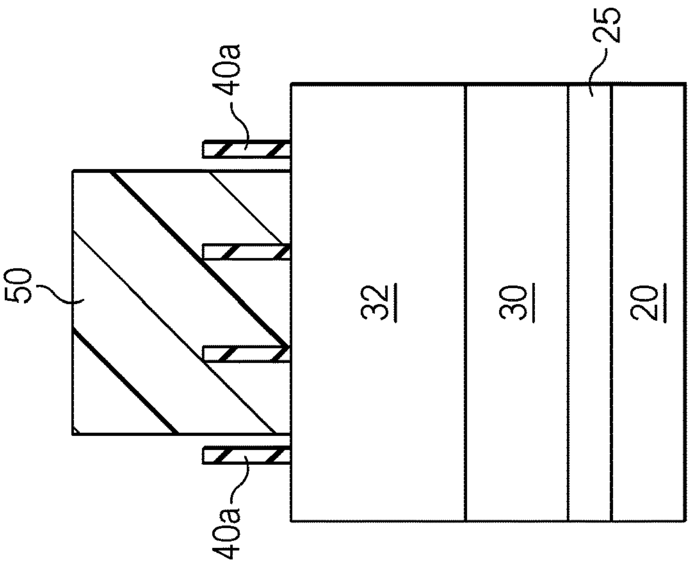
Figure 5E:
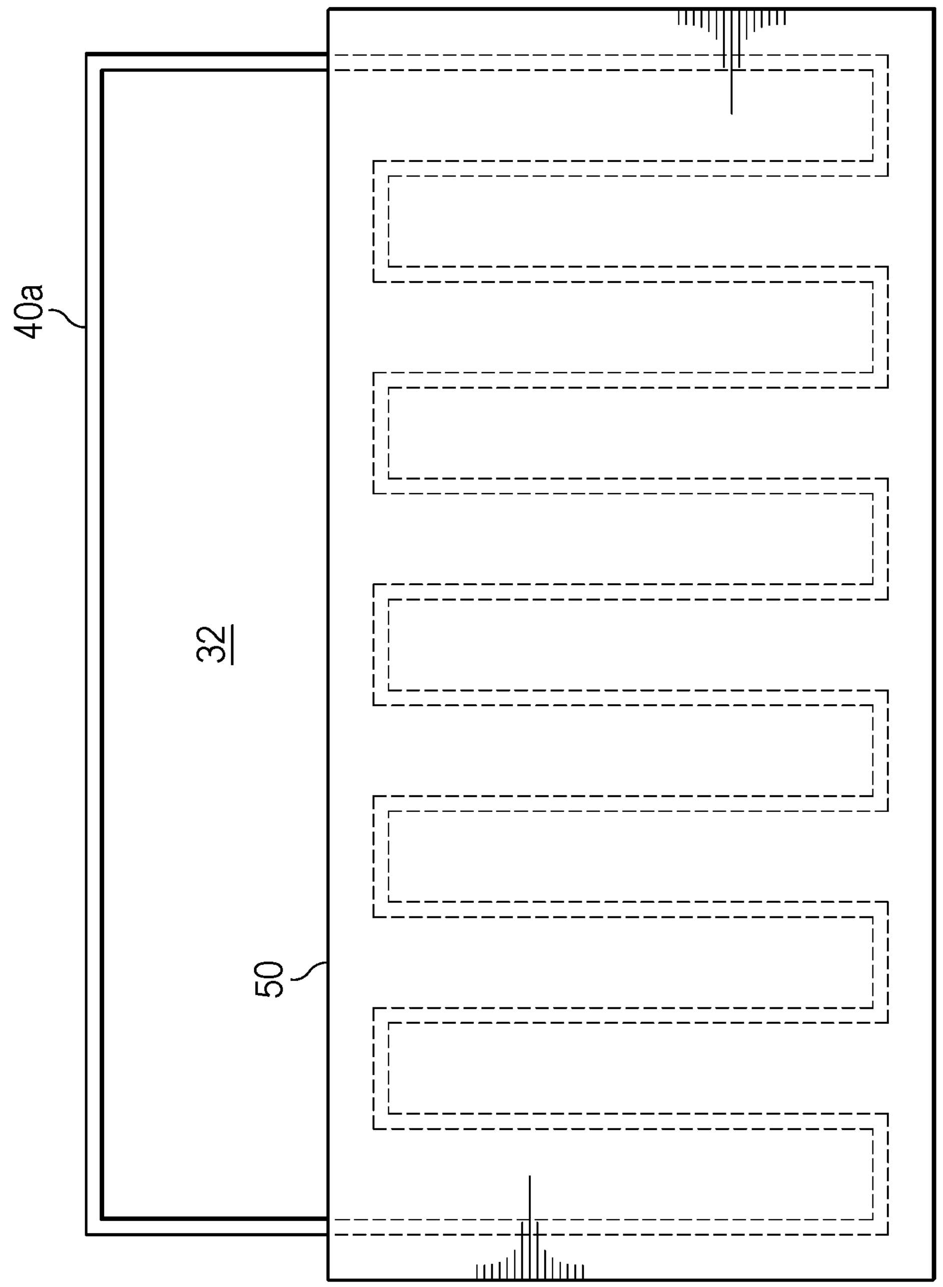

Method 300 further includes forming a block mask having a block mask pattern above and between at least two adjacent spacers, and which is above a portion of the underlayer 32 (block 318). FIGS. 4F and 5E show a corresponding example including a block mask 50 above and between at least two adjacent spacers 40*a*, and which is above a portion of the underlayer 32. In this step, the block mask may be formed (not shown) by spin-coating a photoresist layer and patterning the photoresist layer with a suitable mask using photolithography.

Figure 4G:
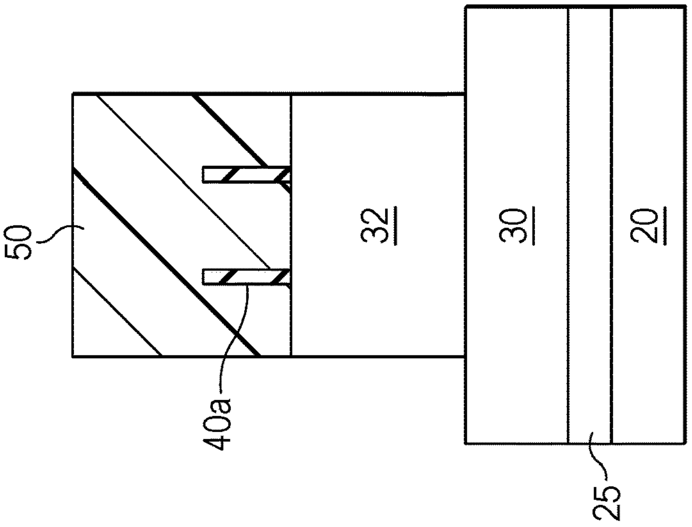

Method 300 further includes removing part of the underlayer 32 in regions unprotected by the block mask formed above (block 320). FIG. 4G shows a corresponding example after removing part of the underlayer 32 and any overlying spacers 40*a*, in regions unprotected by a block mask 50. In this step, the removing may be performed via, for example, reactive ion etching or other wet or dry etch. Portions of the resistive material layer 30 outside of the block mask 50 perimeter may also be removed, exposing the dielectric layer 25. As shown in FIG. 5E, the block mask 50 protects one or more portions of the spacers 40*a* and the underlayer 32, while leaving exposed other portions of the spacers 40*a* and the underlayer 32. The protected portion of the spacers 40*a* may define a pattern related to a passive component, e.g. a serpentine resistor. The exposed portions of the spacers 40*a* are those that are removed to result in the desired pattern of the passive component. Thus definition of the spacers 40*a* in the pattern of the passive device may use two masking levels, including patterning the hard mask 34*a* and the block mask 50.

Figure 4H:
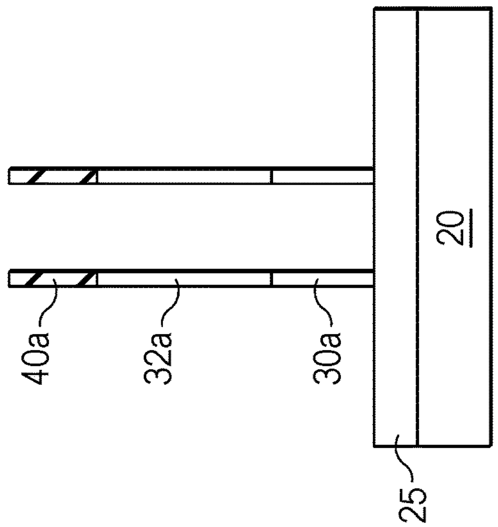

Method 300 further includes removing the block mask 50, portions of the underlayer 32 unprotected by the spacers 40*a*, and portions of the material layer 30 unprotected by the spacers 40*a* (block 322). FIG. 4H shows a corresponding example including after removing the block mask 50 and that portion of the underlayer 32 and material layer 30 unprotected by the spacers 40*a*, resulting in resistive lines 30*a*. In this step, the removing of the block mask 50, underlayer 32, and material layer 30 may be performed via, for example, one or more bath processes appropriate to the material used. A combined stack of a resistive line 30*a*, a remaining portion 32*a* of the underlayer 32, and a spacer 40*a* is illustrative of the SADP technique, in which the remaining portion 32*a* is defined by two patterning levels. An etch process that implements the SADP technique may be referred to as an "SADP etch".

Figure 4I:
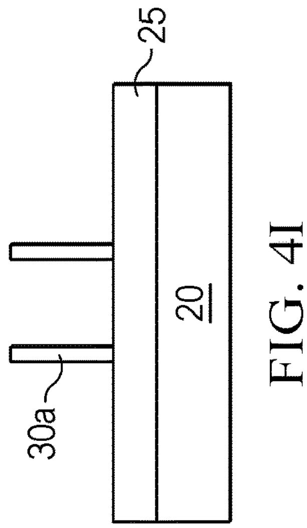
Figure 5F:
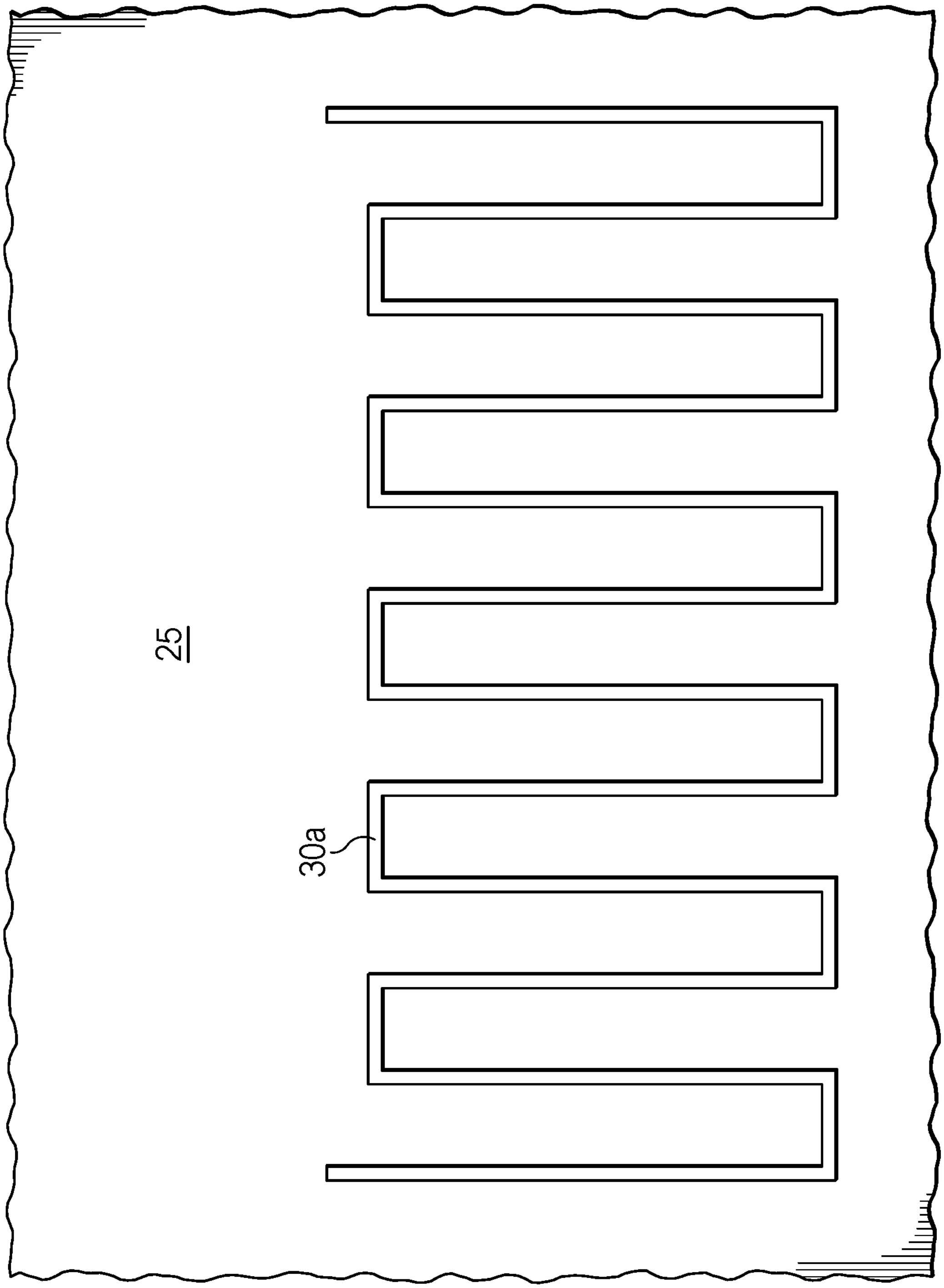

Method 300 further includes removing the spacers 40*a* and portions 32*a* of the underlayer 32 below the spacers 40*a* (block 324) to form the device or passive circuit component. FIG. 4I shows a corresponding example after removing the two adjacent spacers 40*a* and remaining portions 32*a* of the underlayer 32 below the adjacent spacers 40*a*. In this step, the removing of the spacers 40*a* and underlayer 32 may be performed via, for example, wet and/or dry etching. As also shown in FIG. 5F, the resultant example patterned material layer 30 (or conductive pattern) forms resistive lines 30*a* (from which the devices or passive circuit components are formed) thereby remain on the dielectric layer 25. FIG. 4I is a view of a cross-sectional area of two resistive lines (see, for example, FIG. 2B), with the length (long axis, or current-carrying direction) of the resistors extending into the page. The resistive lines 30*a* may be portions of a serpentine resistor or other resistor pattern, and are expected to have low LER due to forming the silicon oxide layer 40 with precisely-controlled atomic layer vacuum depositing. As mentioned above, the patterning and etch processes involved in the SADP process reduce etch-induced line width variation and etch selectivity requirements in order to achieve reduced LER, resulting in smoother and more uniform resistor-to-resistor side edges.

Example implementations consistent with the disclosure are expected to provide conductive or resistive lines having an LER significantly less than such lines in baseline devices. In a non-limiting example, the LER is expected to be about 1.5 nm for the resistive lines 30*a*. Furthermore, the SADP technique may provide conductive or resistive lines having a width on the order of 10 nm, e.g. about 12.5 nm. Such features produced at such dimensions may provide, e.g. reduced resistor size for a same resistance as a similar resistor with larger line width. But such small line widths may have excessive LER when formed by other than an SADP process.

Figure 6:
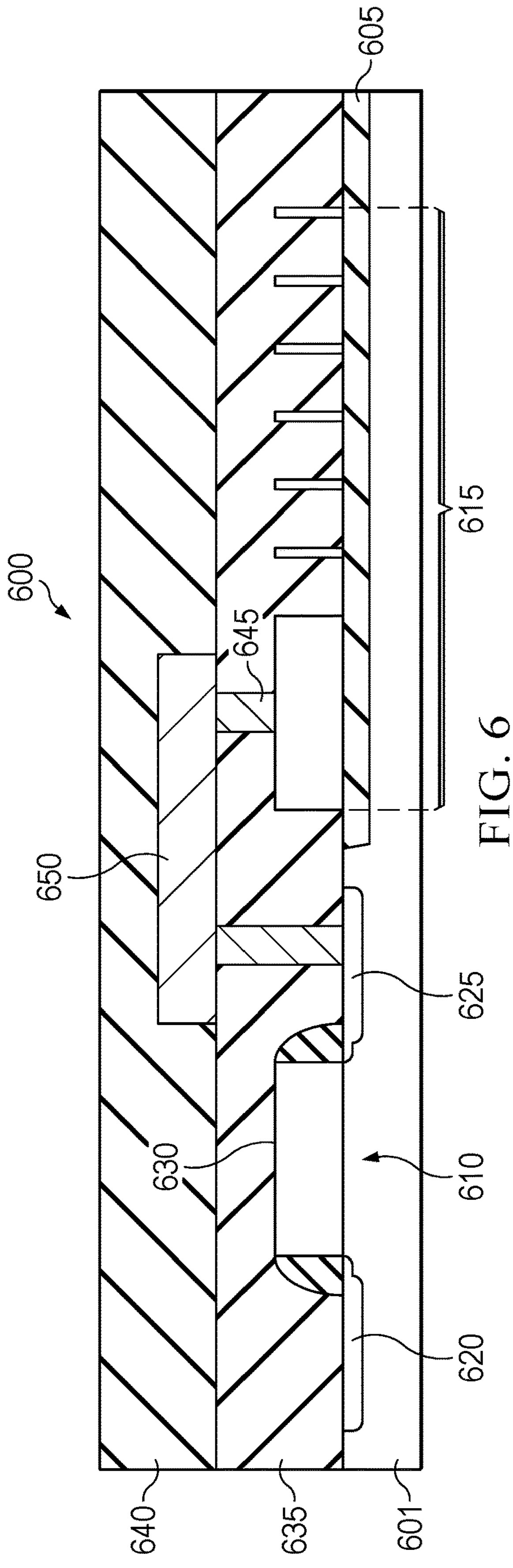
FIG. 6 is a cross-sectional side view of an integrated circuit including a completed thin film resistor (TFR) and a transistor connected by a vias and an interconnect.

FIG. 6 shows an integrated circuit 600 including a completed TFR 615 and a transistor 610 connected by vias and a metal interconnect 650. The TFR 615 is within the scope of previously described examples (see, for example, resistor 30*a*) and is on or over a dielectric isolation layer 605 (see, for example, dielectric layer 25 previously described) which could be STI as shown, or could be LOCOS. The dielectric isolation layer 605 is on or over semiconductor substrate 601 (see, for example, semiconductor substrate 20 previously described) which may be p-type or n-type. The semiconductor substrate 601 in some examples is a doped well region over a bulk substrate such as a semiconductor wafer or singulated die.

The transistor 610 is also on or over the semiconductor substrate 601. The example transistor 610 is a MOS transistor, while other examples may provide a bipolar transistor. The transistor 610 includes a source region 620 and a drain region 625, which are p-type or n-type, but are opposite of the conductivity type of the semiconductor substrate 301. The transistor 610 also includes a gate electrode 630 (e.g., polysilicon) and a gate dielectric (not shown). The metal interconnect 650 may be a line or trace (e.g., aluminum (Al) or copper (Cu)) and electrically connects the TFR 615 to the transistor 610 by metal contacts 645 (e.g., tungsten (W)) within a pre-metal dielectric (PMD) 635 which, for example, includes silicon oxide. The metal interconnect 650 is may be positioned within an intra-metal dielectric (IMD) 640 which, for example, includes silicon oxide.

Unless otherwise stated, “about,” “approximately,” or “substantially” preceding a value means +/−10 percent of the stated value. Modifications are possible in the described examples, and other examples are possible within the scope of the claims.

Modifications are possible in the described embodiments, and other embodiments are possible, within the scope of the claims.

What is claimed is:

1. A method of forming an integrated circuit, comprising:
forming a sacrificial layer pattern over a conductive layer located over a substrate, the conductive layer including nichrome (NiCr), silicon-chromium (SiCr), or silicon-silicon carbide-chromium (SiCCr);
forming dielectric spacers on sidewalls of the sacrificial layer pattern and removing the sacrificial layer pattern between the dielectric spacers, thereby forming a spacer pattern; and
transferring the spacer pattern to the conductive layer thereby forming a conductive pattern.

2. The method as recited in claim 1, wherein the conductive pattern includes a serpentine resistor.

3. The method as recited in claim 1, further comprising connecting the conductive pattern to a transistor that extends into the substrate.

4. The method as recited in claim 1, wherein forming dielectric spacers includes forming a silicon oxide layer by atomic layer vacuum deposition.

5. The method as recited in claim 1, wherein transferring the spacer pattern includes removing a portion of an underlayer located between the sacrificial layer pattern and the conductive layer, and then transferring the spacer pattern to the underlayer.

6. The method as recited in claim 5, wherein removing the portion of the underlayer includes removing an unprotected portion of the spacer pattern.

7. The method as recited in claim 1, wherein the sacrificial layer pattern is formed from a polymeric material.

8. The method as recited in claim 1, wherein the dielectric spacers comprise silicon oxide.

9. A method of forming an integrated circuit, comprising:
forming a sacrificial layer pattern over a chromium alloy layer over a semiconductor substrate;
forming dielectric spacers on sidewalls of the sacrificial layer pattern;
removing the sacrificial layer pattern between the dielectric spacers, thereby forming a spacer pattern; and
transferring the spacer pattern to the chromium alloy layer thereby forming a resistive pattern.

10. The method as recited in claim 9, wherein the resistive pattern includes a serpentine resistor.

11. The method as recited in claim 9, further comprising connecting the resistive pattern to a transistor that extends into the semiconductor substrate.

12. The method as recited in claim 9, wherein forming the dielectric spacers includes forming a silicon oxide layer on top surfaces and sidewalls of the sacrificial layer pattern and removing the silicon oxide layer over the top surfaces.

13. The method as recited in claim 9, wherein transferring the spacer pattern includes removing a portion of an underlayer located between the sacrificial layer pattern and the chromium alloy layer, and then transferring the spacer pattern to the underlayer.

14. The method as recited in claim 13, wherein removing the portion of the underlayer includes removing an unprotected portion of the spacer pattern.

15. The method as recited in claim 9, wherein the sacrificial layer pattern is formed from a silicon-containing polymer.

16. The method as recited in claim 9, wherein the dielectric spacers comprise silicon oxide.

17. The method as recited in claim 9, wherein the chromium alloy layer is formed on a dielectric isolation layer on the semiconductor substrate.

* * * * *